(12) United States Patent
Tsai et al.

(10) Patent No.: US 6,440,818 B1
(45) Date of Patent: Aug. 27, 2002

(54) METHOD OF REDUCING LEAKAGE CURRENT OF A SEMICONDUCTOR WAFER

(75) Inventors: Yuan-Li Tsai, Taipei; Kuo-Hua Ho, Hsin-Chu; Kai-Jen Ko, Hsin-Tien; Cheng-Hui Chung, Hsin-Chu Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/828,789

(22) Filed: Apr. 10, 2001

(51) Int. Cl.[7] .............................................. H01L 21/76
(52) U.S. Cl. ...................................................... 438/443
(58) Field of Search ................................. 438/443, 706, 438/714, 723, 745, 749, 750

(56) References Cited

U.S. PATENT DOCUMENTS 5,554,560 A * 9/1996 Hsue et al. .................... 437/69
5,736,451 A * 4/1998 Gayet ........................... 438/443
6,255,022 B1 * 7/2001 Young et al. .................. 430/5
6,255,188 B1 * 7/2001 Chen et al. .................. 438/400

* cited by examiner

Primary Examiner—Hoai Ho
Assistant Examiner—Quoc Hoang
(74) Attorney, Agent, or Firm—Winston Hsu

(57) ABSTRACT

A semiconductor wafer includes a silicon substrate, an active area positioned on the silicon substrate, and a field oxide layer positioned on the surface of the silicon substrate surrounding the active area. The present invention forms a doped area in the silicon substrate and within the active area and then deposits a dielectric layer on the surface of the semiconductor wafer. A dry etching process is performed to remove the dielectric layer. The top power of the dry etching process ranges between three hundred and five hundred watts to prevent damage to the silicon substrate near the field oxide layer and within the active area by the dry etching process, and to reduce the leakage current of the doped area. Additionally, the present invention also uses a wet etching process to remove the dielectric layer, which prevents an anisotropic physical impact on the silicon substrate near the field oxide layer to reduce the leakage current of the doped area.

19 Claims, 4 Drawing Sheets

METHOD OF REDUCING LEAKAGE CURRENT OF A SEMICONDUCTOR WAFER

BACKGROUND OF THE INVENTION

1. Field of the Invention

The present invention relates to a method of reducing leakage current of a semiconductor wafer, and more particularly, to a method of etching to reduce leakage current of a semiconductor wafer.

2. Description of the Prior Art

In the field of semiconductor production technology, the measurement of leakage current is a necessary testing tool. The magnitude of the leakage current closely relates to either the lifetime or the current generation rate of the minority carriers. Any defects or damage in the depletion bulk causes an increase of the leakage current.

Please refer to FIG. 1 to FIG. 3. FIG. 1 to FIG. 3 are schematic diagrams of a self-aligned silicide (salicide) process according to the prior art. In the prior art method, salicide is formed on a semiconductor wafer 10, the semiconductor wafer 10 comprising a silicon substrate 12, an active area 16 positioned on the silicon substrate 12, and a field oxide (FOX) layer 18 positioned on the surface of the silicon substrate 12. The FOX layer 18 comprises a bird's beak structure 20 that surrounds the active area 16.

As shown in FIG. 1, an ion implantation process is performed to form a P-type doped area 22 in the silicon substrate 12 and within the active area 16, and then a silicon oxide layer 24 is deposited on the surface of the semiconductor wafer 10. A photolithographic process is performed to form a photoresist layer 26, and a salicide block (SAB) mask is used to define a region for the salicide layer.

As shown in FIG. 2, a dry etching process is performed after the photolithographic process to remove the silicon oxide layer 24 not covered by the photo resist layer 26, and then the photo-resist layer 26 is removed completely. In a traditional dry etching process, the range of the top power is about 700 watts. As shown in FIG. 3, a salicide process is at last performed to form a salicide layer 28 on the surface of the P-type doped area 22.

After the salicide process finished, however, a high value of leakage current is measured when a wafer acceptance test (WAT) is performed at the test key of the P-type doped area 22/N-well 14. This is due to the high top power of 700 watts of the dry etching process, which destroys the edges of the active region, and sinking of the silicon substrate 12 occurs near the bird's beak structure 20. The occurrence of so many lattice defects induces the leakage current. Additionally, the same problems happen to the test key of an N-type doped area/P-well. But the salicide layer 28 on the surface of the P-type doped area 22/N-well 14 is less uniform, so the leakage current value of the P-type doped area 22/N-well 14 is higher than that of an N-type doped area/P-well.

For dynamic random access memory (DRAM) products, a higher value of the leakage current results in a faster loss of signals in a DRAM cell and a shortened refresh time, and hence a DRAM cell is less steady and electricity is wasted.

SUMMARY OF THE INVENTION

It is therefor an object of the present invention to provide a method of reducing leakage current of the doped area on a semiconductor wafer.

In a preferred embodiment, the present invention provides a method of reducing leakage current of a semiconductor wafer, The semiconductor wafer comprises a silicon substrate, an active area positioned on the silicon substrate, and a field oxide layer positioned on the surface of the silicon substrate surrounding the active area. According to the present invention, a doped area is formed in the silicon substrate and within the active area, and a dielectric layer is deposited on the semiconductor wafer. Then, a dry etching process is performed to remove the dielectric layer. The top power of the dry etching process ranges between three hundred and five hundred watts to prevent damage to the silicon substrate near the field oxide layer and within the active area, and so the leakage current is reduced.

In a second embodiment, the present invention performs a wet etching process to remove the dielectric layer after the dielectric layer is deposited. An anisotropic physical impact to the silicon substrate near the field oxide layer is prevented, and sinking of the salicide layer near the field oxide layer is also prevented. As a result, the leakage current of the doped area is reduced.

In a third embodiment, a dry etching process is performed after the dielectric layer is deposited to etch the dielectric layer to a predetermined height. Then, a wet etching process is performed to remove the dielectric layer. An anisotropic physical impact on the silicon substrate near the field oxide layer is prevented. The dry etching process is performed to shorten the reaction time of the wet etching process.

It is an advantage of the present invention that it prevents an anisotropic physical impact on the silicon substrate near the field oxide layer by a dry etching process with a low power, or by a wet etching process. Sinking in the neighborhood of the field oxide layer is prevented, and hence the leakage of the doped area is reduced.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
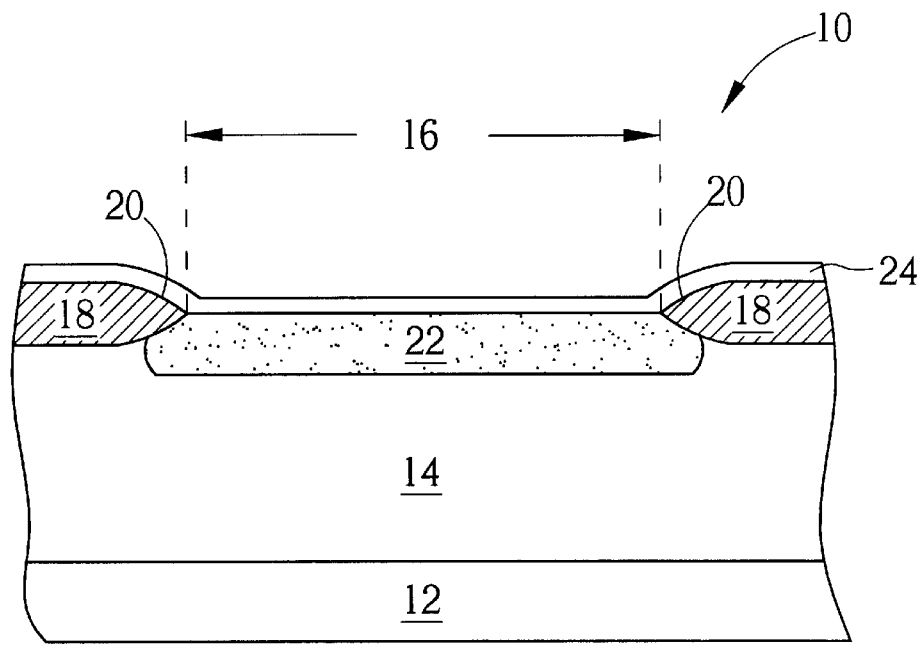
FIG. 1 to FIG. 3 are schematic diagrams of a prior art method of a salicide process.
Figure 2:
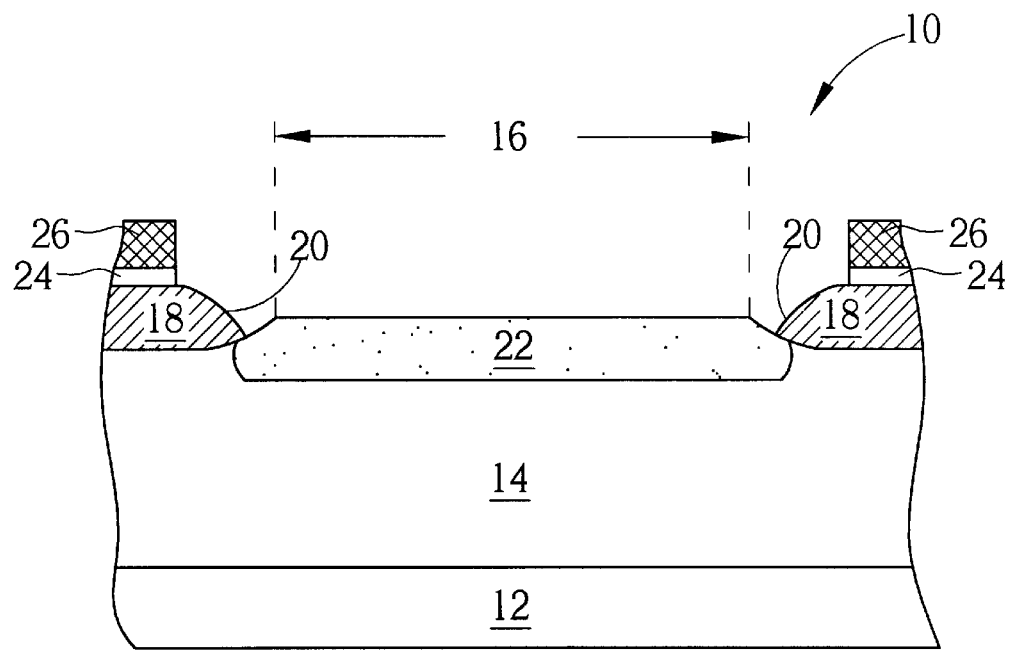
Figure 3:
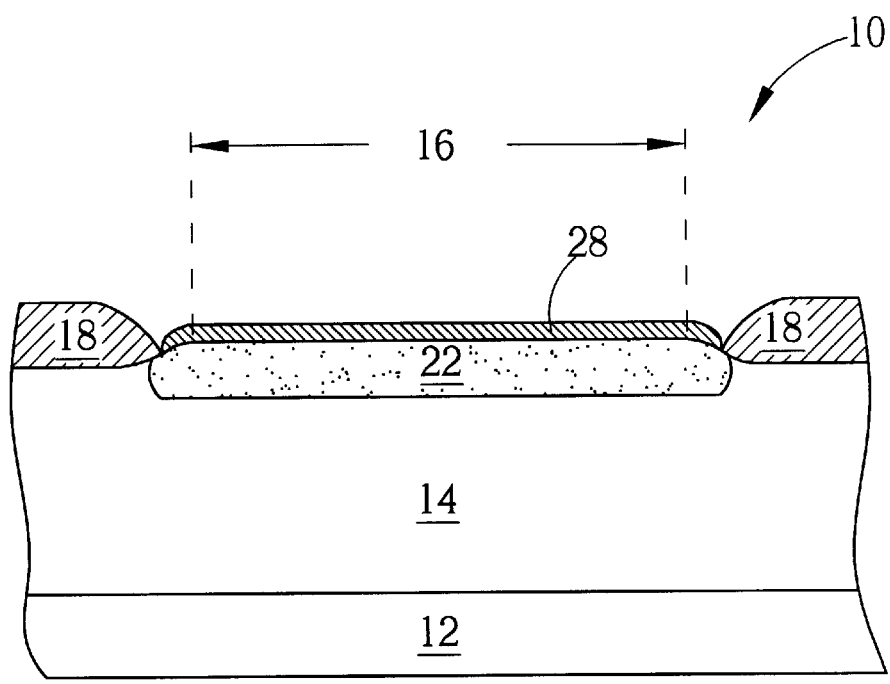
Figure 4:
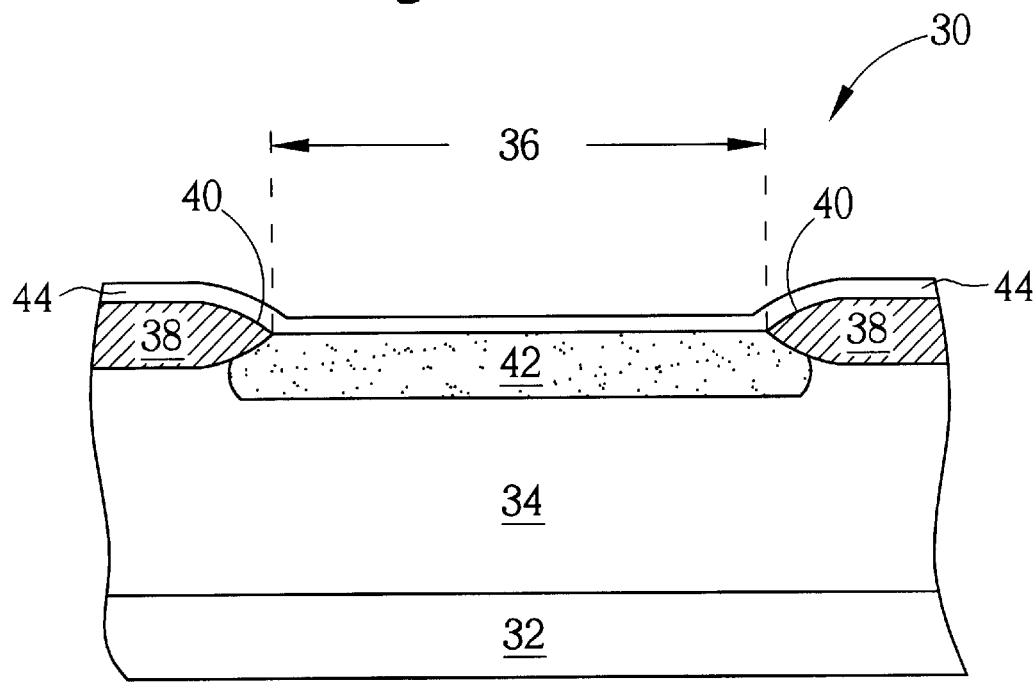
FIG. 4 to FIG. 6 are schematic diagrams of a method to reduce leakage current of a semiconductor wafer according to the present invention.
Figure 5:
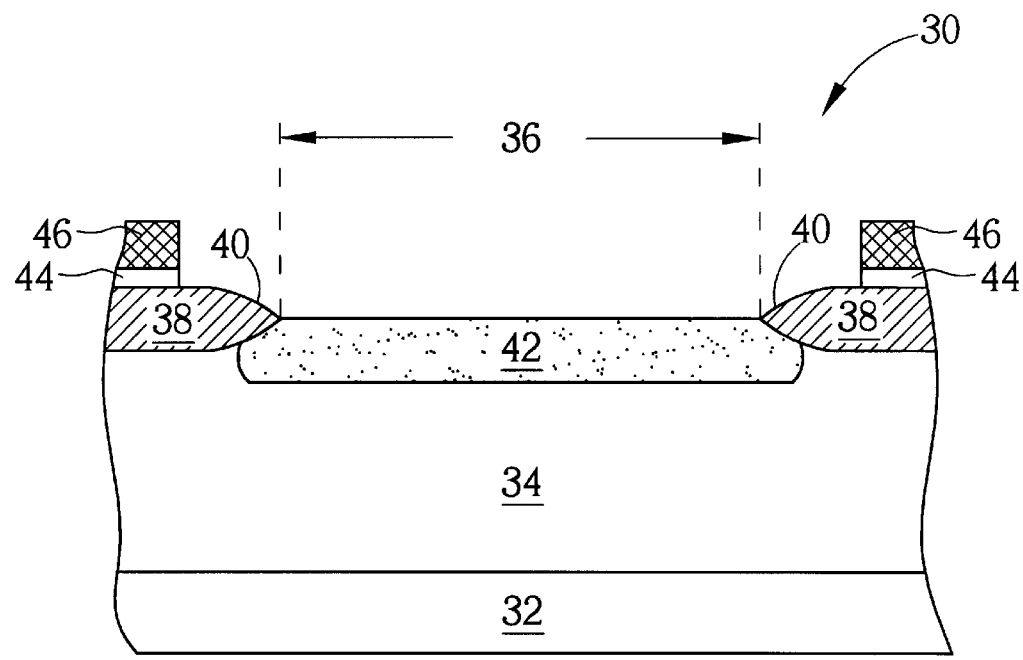
Figure 6:
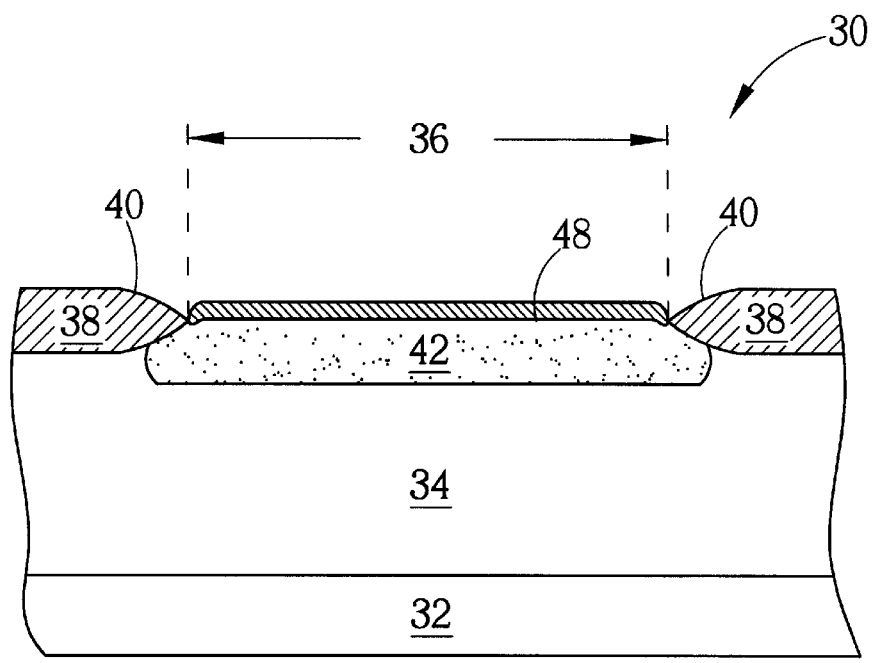

Please refer to FIG. 4 to FIG. 6. FIG. 4 to FIG. 6 are schematic diagrams of a method to reduce leakage current of a semiconductor wafer 30 according to the present invention. The semiconductor wafer 30 comprises a silicon substrate 32, an N-well 34 positioned on the surface of the silicon substrate 32, an active area 36 positioned on the silicon substrate 32, and a field oxide (FOX) layer 38 positioned on the surface of the silicon substrate 32. The FOX layer 38 comprises a bird's beak structure 40 that surrounds the active area 36.

As shown in FIG. 4, the present invention salicide process performs an ion implantation process or a thermal diffusion process to form a P-type doped area 42 in the silicon substrate 32 and within the active area 36. Then, an LPCVD process is performed utilizing tetra-ethyl-ortho-silicate (TEOS) to deposit a silicon oxide layer 44 on the surface of the semiconductor wafer 30. The thickness of the silicon oxide layer 44 is about 500 angstroms, and different thicknesses of the silicon oxide layer 44 may be deposited depending on the process needs. A photolithographic process is performed to form a photoresist layer 46, and a salicide block (SAB) mask is used to define a region of the salicide layer.

As shown in FIG. 5, a dry etching process is performed after the photolithographic process to remove the silicon oxide layer 44 not covered by the photoresist layer 46. The top power of the dry etching process is about three hundred to five hundred watts according to the present invention, and the gases used comprise carbon tetrafluoride ($CF_4$) gas, carbon trifluoride ($CHF_3$) gas and argon (Ar) gas. The flow rate of the carbon tetrafluoride gas ranges between thirty-five and forty-five sccm (standard cubic centimeter per minute). The flow rate of the carbon trifluoride gas ranges between twenty-five and thirty-five sccm. The flow rate of the argon gas ranges between eight hundred and one thousand sccm. In the dry etching process, the photoresist layer 46 is then removed completely. As shown in FIG. 6, a salicide process is at last performed to form a salicide layer 48 on the surface of the P-type doped area 42.

Figure 7:
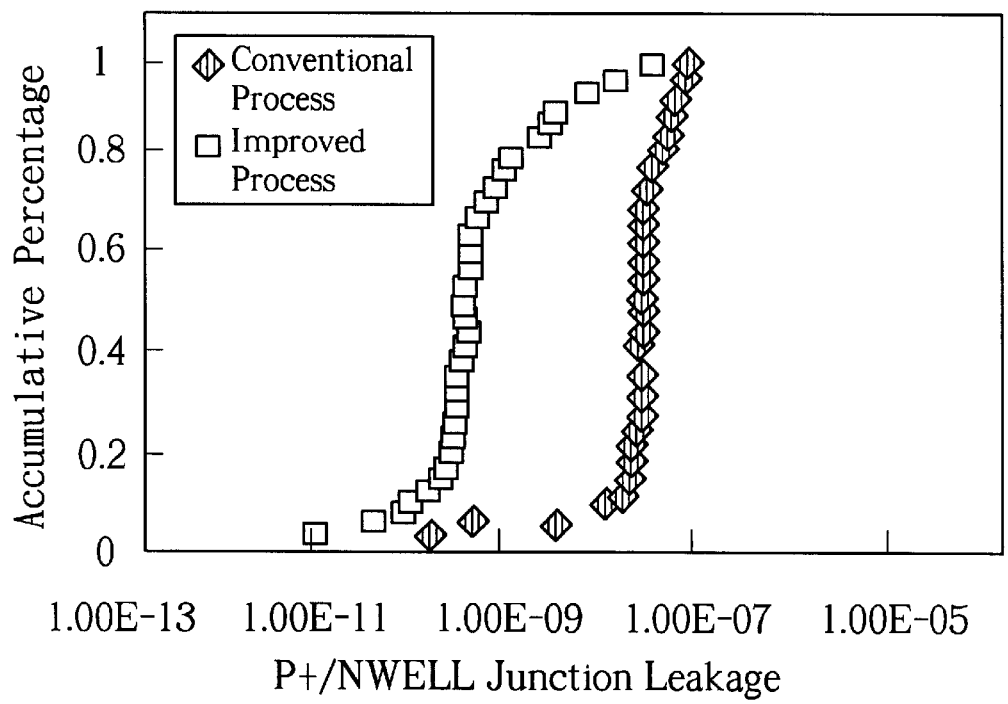
FIG. 7 is a schematic diagram of the leakage current comparison between the prior art salicide process and the present invention salicide process.

Please refer to FIG. 7. FIG. 7 is a schematic diagram of a leakage current comparison between the prior art salicide process and the present invention salicide process. As shown in FIG. 7, there is about a one to two orders of magnitude decrease of the leakage current of the P-doped area 42/N-well 34 according to the present invention compared to the P-doped area 22/N-well 14 of the prior art. In addition, nearly seventy percent of the leakage current of the P-doped area 42/N-well 34 is less than $1\times10^{-9}$ Amperes (A). In contrast, less than ten percent of the leakage current of the P-doped area 22/N-well 14 of the prior art is less than $1\times10^{-9}$ A.

It has been determined that the top power range of the dry etching process according to the present invention efficiently prevents damages of the silicon substrate 32 near the field oxide layer 38 and within the active area 36 during the dry etching process. As a result, leakage current of the P-type doped area 42 is reduced.

The second embodiment has a similar manufacturing process with the above process. The difference is that the second embodiment performs a wet etching process after the photolithographic process. Hydrofluoric acid (HF) or dilute hydrofluoric acid (DHF) is used in the wet etching process to remove the silicon oxide layer 44 not covered by the photoresist layer 46. An anisotropic physical impact on the bird's beak structure 40 and on the silicon substrate 32 near the bird's beak structure 40 is completely prevented because the second embodiment uses a wet etching process to replace the dry etching process. So sinking of the salicide layer 48 near the bird's beak structure 40 is prevented, and simultaneously the salicide layer 48 is prevented from being too close to the P-type doped area 42/N-well 34 edge, which reduce the leakage current of the P-type doped area 42.

Figure 8:
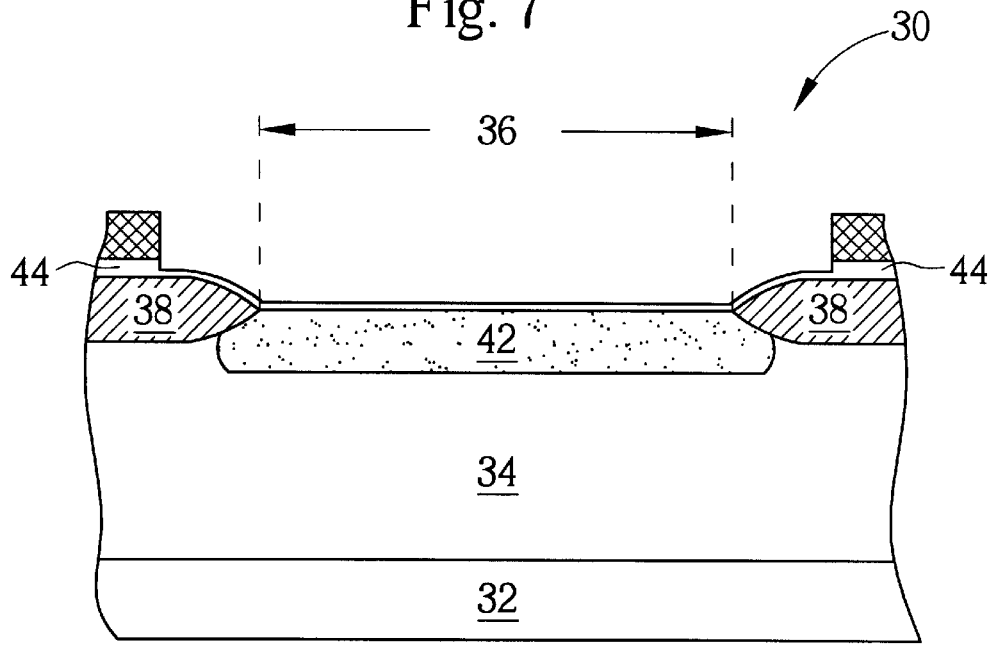
FIG. 8 is a schematic diagram of the third embodiment according to the present invention.

Please refer to FIG. 8. FIG. 8 is a schematic diagram of the third embodiment according to the present invention. As shown in FIG. 8, the third embodiment of the present invention performs a dry etching process between the photolithographic process and the wet etching process in the second embodiment. The dry etching process etches the silicon oxide layer 44 to a predetermined height to reduce the reaction time of the following wet etching process.

It is a feature of the present invention to use a low power dry etching process or a wet etching process to prevent an anisotropic physical impact on the silicon substrate 32 near the field oxide layer 38. Hence, sinking of the salicide layer 48 near the bird's beak structure is prevented, the salicide layer 48 is prevented from being too close to the P-type doped area 42/N-well 34 edge, and the leakage current of the P-type doped area 42/N-well 34 is reduced as a result.

In contrast to the prior art salicide process, the method of the present invention reduces by one to two orders of magnitude of the leakage current of the P-type doped area/N-well. Hence, the present invention prevents the rapid loss of signals in a DRAM cell, or improves the signal-to-noise ratio of the sensors.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of reducing leakage current of a semiconductor wafer, the semiconductor wafer comprising a silicon substrate, an active area positioned on the silicon substrate, and a field oxide (FOX) layer positioned on the silicon substrate surrounding the active area, the method comprising:

forming a doped area in the silicon substrate within the active area;

depositing a dielectric layer on the semiconductor wafer;

performing a dry etching process to remove at least a portion of the dielectric layer to expose the surface of the silicon substrate in the active area, and ranging the top power of the dry etching process to between three hundred and five hundred watts; and performing a self-aligned silicide (salicide) process to form a self-aligned silicide layer on the surface of the doped area;

wherein the top power range defined in the dry etching process prevents the dry etching process from destroying the silicon substrate adjacent to the field oxide layer and within the active area, and hence reduces leakage current of the doped area.

2. The method of claim 1 wherein a photolithographic process is performed between the deposition process of the dielectric layer and the dry etching process, the photolithographic process defining a region of the salicide layer utilizing a salicide block (SAB) mask.

3. The method of claim 1 wherein carbon tetrafluoride ($CF_4$) gas, carbon trifluoride ($CHF_3$) gas and argon (Ar) gas are used in the dry etching process.

4. The method of claim 3 wherein the flow rate of the carbon tetrafluoride gas ranges between thirty-five and forty-five sccm (standard cubic centimeter per minute), the flow rate of the carbon trifluoride gas ranges between twenty-five and thirty-five sccm, and the flow rate of the argon gas ranges between eight hundred and one thousand sccm.

5. The method of claim 1 wherein the doped area is a P-type doped area, and the top power range defined in the dry etching process may prevent the salicide layer from being too close to the sidewall edge of the P-type doped area to reduce the leakage current.

6. The method of claim 5 wherein the semiconductor wafer comprises an N-type well (N-well) positioned on the silicon substrate and below the P-type doped area.

7. The method of claim 1 wherein the dielectric layer is a silicon oxide layer.

8. The method of claim 7 wherein the silicon oxide layer is formed by a low pressure chemical vapor deposition (LPCVD) process using tetra-ethyl-ortho-silicate (TEOS).

9. The method of claim 7 wherein the thickness of the silicon oxide layer is about 500 angstroms (Å).

10. A method of reducing leakage current of a semiconductor wafer, the semiconductor wafer comprising a silicon substrate, at least one active area positioned in a region of the silicon substrate, and a FOX layer positioned on the surface of the silicon substrate, the FOX layer comprising a bird's beak structure surrounding the active area, the method comprising:

forming a doped area in the silicon substrate within the active area;

depositing a dielectric layer on the semiconductor wafer;

performing a photolithographic process to define a predetermined region of a self-aligned silicide (salicide) layer utilizing a salicide block (SAB) mask;

performing a dry etching process to etch the dielectric layer to a predetermined height;

performing a wet etching process to remove the remaining dielectric layer in the predetermined region to expose the surface of the silicon substrate; and performing a salicide process to form a salicide layer on the surface of the predetermined region;

wherein the dry etching process reduces the reaction time of the wet etching process, and the wet etching process prevents an anisotropic physical impact on the bird's beak structure and on the silicon substrate neighboring the bird's beak structure, which prevents sinking of the salicide layer near the bird's beak structure, and hence reduces leakage current of the doped area.

11. The method of claim 10 wherein carbon tetrafluoride ($CF_4$) gas, carbon trifluoride ($CHF_3$) gas and argon (Ar) gas are used in the dry etching process.

12. The method of claim 11 wherein the flow rate of carbon tetrafluoride gas ranges between thirty-five and forty-five sccm (standard cubic centimeter per minute), the flow rate of the carbon trifluoride gas ranges between twenty-five and thirty-five sccm, and the flow rate of the argon gas ranges between eight hundred and one thousand sccm.

13. The method of claim 10 wherein the doped area is a P-type doped area, and the wet etching process may prevent the salicide layer from being too close to the sidewall edge of the P-type doped area to reduce the leakage current.

14. The method of claim 13 wherein the semiconductor wafer comprises an N-type well(-well) positioned on the silicone substrate below the P-type doped area.

15. The method of claim 10 wherein the dielectric layer is a silicon oxide layer.

16. The method of claim 15 wherein the silicon oxide layer is formed by a low pressure chemical vapor deposition (LPCVD) process using tetra-ethyl-ortho-silicate (TEOS).

17. the method of claim 15 wherein the thickness of the silicon oxide layer is about 500 angstroms (Å).

18. The method of claim 10 wherein a hydrofluoric acid solution is used in the wet etching process.

19. The method of claim 10 wherein a diluted hydrofluoric acid (DHF) solution is used in the wet etching process.

* * * * *